United States Patent [19]

Kuroda

[11] 4,211,975
[45] Jul. 8, 1980

[54] LOCAL SIGNAL GENERATION ARRANGEMENT

[75] Inventor: Masahiro Kuroda, Tokyo, Japan

[73] Assignee: Anritsu Electric Company, Limited, Japan

[21] Appl. No.: 893,447

[22] Filed: Apr. 4, 1978

[51] Int. Cl.² .............................................. H04B 1/40
[52] U.S. Cl. ..................................... 455/75; 455/202; 455/259; 331/18; 455/316
[58] Field of Search ...................... 325/17, 50, 63, 137, 325/148, 184, 329, 418, 330, 419, 420, 421, 422, 423; 331/10, 16, 18, 19, 22, 30, 31

[56] References Cited

U.S. PATENT DOCUMENTS

| | | | |
|---|---|---|---|
| 4,027,242 | 5/1977 | Yamanaka | 325/17 |
| 4,061,973 | 12/1977 | Reimers et al. | 325/25 |
| 4,086,545 | 4/1978 | Teshirogi | 325/17 |
| 4,095,183 | 6/1978 | Kakigi | 325/427 |

*Primary Examiner*—Benedict V. Safourek
*Assistant Examiner*—Tommy P. Chin
*Attorney, Agent, or Firm*—Robert E. Burns; Emmanuel J. Lobato; Bruce L. Adams

[57] ABSTRACT

The local signal generation arrangement employed in a radio communication system for transmitting and/or receiving an upper sideband (USB) and a lower sideband (LSB) signal, but not simultaneously, employs a method in which the generation and/or detection of both USB and LSB signals is accomplished by utilizing only one bandpass filter, a so-called single sideband (SSB) filter, together with a balanced modulator arranged to receive a carrier signal produced from an oscillator whose frequency is accordance with the characteristic frequency of either of a pair of crystal resonators, which correspond to the upper cut-off and the lower cut-off frequencies of the SSB bandpass filter, respectively. The output signal from the said SSB filter is referred to herein as the intermediate frequency (IF) signal.

The local signal generation arrangement includes a phase-locked loop (PLL) including at least a phase comparator, a low pass filter, and a voltage-controlled oscillator (VCO). The arrangement further includes a standard signal oscillator, a frequency divider, and a pair of quartz crystal resonators used for the USB mode and for the LSB mode, respectively. The PLL further includes in its feedback loop a programmable frequency divider the division ratio of which is determined by a digital signal fed in parallel form from a channel selection means. The PLL optionally includes a mixer and a frequency selection means which is adapted to select one of harmonics produced from the mixer. These may be incorporated in order to reduce the frequency of the signal to be divided by the programmable frequency divider. If the mixer and the frequency selective means are used, then the arrangement also includes a frequency multiplier adapted to produce an output signal the frequency of which is an integral multiple of that of the input to said frequency multiplier.

10 Claims, 11 Drawing Figures

|  | LOWER HETERODYNE | | UPPER HETERODYNE | |
| --- | --- | --- | --- | --- |
|  | USB | LSB | USB | LSB |
| Fi in kHz | 10.692 | 10.695 | 10.695 | 10.692 |
| $F_\ell$ in kHz | 16.273~16.713 | 16.270~16.710 | 37.660~38.100 | 37.657~38.097 |
| Fs in kHz | 10241.863 | 10240 | 10240 | 10239.189 |
| Fn in kHz | 10.001819 | 10.0 | 10.0 | 9.999208 |
| Fd in Hz | −40~+40 | 0 | 0 | +17.4~−17.4 |
| N | 91 ~ 135 | | 182 ~ 226 | |
| $M_4$ | 2 | | 2 | |
| $M_5$ | 512 | | 512 | |
| $M_3$ | 3 | | 7 | |
| Fa in kHz | 910 ~ 1350 | | 1820 ~ 2260 | |
| Fj in kHz | 15362.794 | 15.300 | 35.840 | 35.837.162 |
| Fo in kHz | 26.965 ~ 27.405 | | | |

LOCAL SIGNAL GENERATION ARRANGEMENT

BACKGROUND OF THE INVENTION (1) Field of the Invention

This invention relates to a local signal generation arrangement and, more particularly, to a local signal generation arrangement of the type utilizing the PLL technique and employed in a SSB transmitter and/or receiver employing a method for transmitting and/or receiving an USB and a LSB signals, but not simultaneously.

(2) Description of the Prior Art

Heretofore two methods have principally been used for transmission or reception of the USB and the LSB signals.

One method employs a pair of SSB filters which are used for USB selection and for the LSB, respectively. Another method employs a single SSB filter, and varies the frequency applied to the input of a balanced modulator which produces the amplitude-modulated, carrier suppressed, signal.

The latter method, to which the present invention can be applied, has been frequently used because of lower cost due to the elimination of a very expensive SSB filter, which is usually a crystal filter. However, this method is disadvantageous in that a frequency deviation occurs in the output signal due to changing between USB and LSB modes at the IF stage. To prevent this, the frequency of the local signal generator must be shifted by the amount of the frequency deviation occurring at the IF stage, in order to compensate deviation. A unique method is proposed by the present invention to resolve the above problem.

OBJECTS AND SUMMARY OF THE INVENTION

It is a primary object of this invention to provide a local signal generation arrangement employing a phase-locked loop which utilizes a unique circuit construction which reduces cost and complexity.

Another object of the present invention is to provide a local signal generation arrangement with fewer components, and hence greater reliability.

An important feature of the present invention resides in the fact that a simplified local signal generation arrangement is achieved by daringly varying the frequency of a reference oscillator which it is deemed to be negative in a prior art to change the reference frequency.

BRIEF DESCRIPTION OF THE DRAWINGS

The nature of the present invention and its various advantages will become more apparent by referring to the following detailed description in conjunction with the appended drawings, in which.

DESCRIPTION OF THE PREFERRED EMBODIMENTS

As will be apparent to one skilled in the art, the drawings are not complete diagrams of actual transceivers. Many blocks such as the blocks composing the receiver section, DC and AC amplifiers, etc. are omitted in order to clearly illustrate the present invention.

Figure 1:
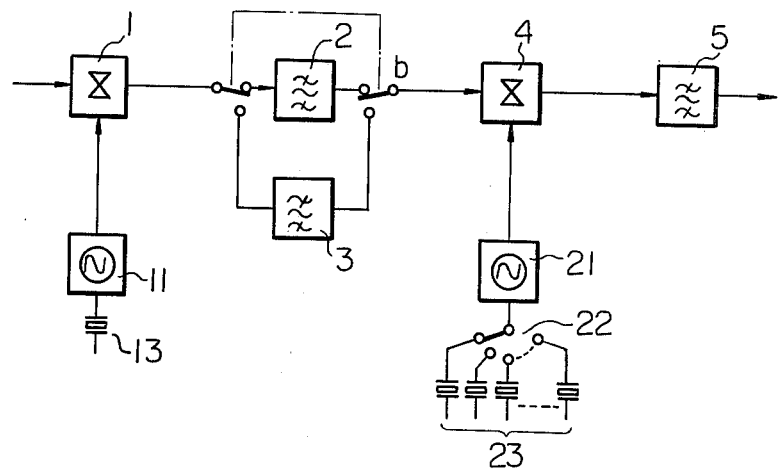
FIG. 1 is a simplified block diagram of an conventional style SSB transmitter and is used in explaining how a SSB transmitter generates SSB signal.
Figure 2:
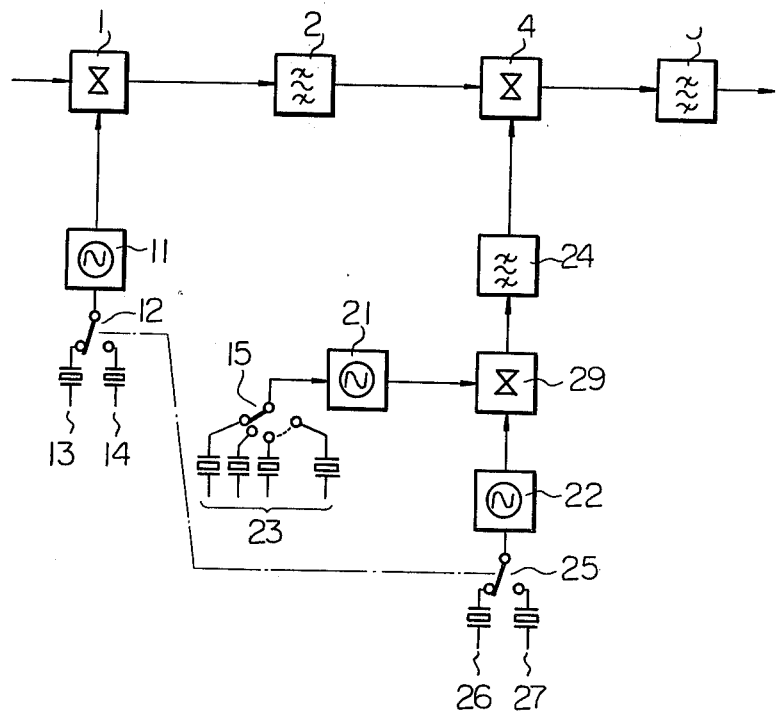
FIG. 2 is a simplified block diagram of another type of conventional SSB transmitter.

FIG. 1 and FIG. 2 are block diagrams explaining two ways commonly used for producing both USB and LSB signals, independently from one another.

FIG. 1 shows a simplified block diagram of a typical prior art SSB transmitter. It should be noticed that this figure, as well as the other figures, relates to only a transmitting stage; however, it can be adapted to a SSB receiver by making slight changes. According to FIG. 1, a method of generating SSB radio signals is explained. A carrier signal produced from a first oscillator 11 whose frequency is determined by a quartz crystal resonator 13 is fed to an input of a balanced modulator 1, and then ampliftude-modulated by a modulation signal fed to another input of the modulator. Either a USB or LSB carrier-suppressed, signal produced from the modulator is selected by a switching means 6, which selects one of two bandpass filters. These are called as SSB filters, which are usually crystal filters, one of which is for the USB and the other for the LSB. (I.e., the center frequency and bandwidth of the filters are determined so as to pass the USB and LSB, respectively.) The carrier signals is suppressed by the inherent characteristic of the balanced modulator, with the aid of attenuation characteristics of the bandpass filter. The USB or LSB signal produced from the modulator 1 through the bandpass filter 2 or 3 and the USB-LSB selection means 6 is fed to an input of a frequency mixer 4 and converted in frequency by a signal fed to another input of the mixer to yield an output signal at the desired frequency. The input signal of the other input of mixer 4 is produced from a local signal oscillator 21 which generates a signal the frequency of which is decided by a quartz crystal unit selected from a number of crystal resonators 23 by a channel selection means 22. The output signal from the frequency mixer 4 is filtered by a bandpass filter or a lowpass filter, to eliminate unwanted spurious signals, and fed to the transmitting output stage (not shown), by which the signal is amplified and provided to the antenna of the system.

FIG. 2 shows a simplified block diagram of more typical SSB transmitting equipment employing an arrangement different from that of FIG. 1. However, the arrangement shown in FIG. 2 functions in the same manner as that of FIG. 1. In FIG. 2 only one bandpass filter is used to yield the SSB signals instead of the two bandpass filters of FIG. 1, to reduce the cost by eliminating a very expensive crystal filter, and the frequency of the first oscillator 11 (the same as that of FIG. 1) is changed in order to select the USB or LSB. To accomplish this, a pair of quartz crystal units 13 and 14 are provided, the oscillating frequencies of which correspond to the lower cut-off frequency and the upper cut-off frequency of SSB bandpass filter respectively. Furthermore, a USB-LSB selective means 12 is provided which selects one from two crystal units 13 and 14 in order to select the USB or LSB mode. Here, a problem arises because in order to provide an USB and LSB of frequencies which will be passed by bandpass filter 2, the carrier frequency must be changed by an amount equal to the bandwidth of filter 2, when sideband switching is performed. Therefore, in FIG. 2 another type of local-signal generation arrangement is shown. This comprises a second oscillator 21 for selection of channels, third oscillator 22 for selection of the USB or LSB mode, second mixer 29 for frequency conversion and for producing the sum of and difference between the frequencies fed to the two inputs thereof, a bandpass or lowpass filter 24 which selects the sum or difference frequency at the output of the second mixer 29, channel selection means 15 and a USB-LSB selection means 12. In this arrangement, the channel selection means 15 chooses one of several crystal resonators 23 provided for applying a desired frequency to the second mixer 4, and USB-LSB selection means 25 selects one of a pair of crystal resonators 26 and 27 to compensate the frequency deviation occuring at the output of the intermediate frequency stage caused by changing modes. The output from oscillator 22 is applied as an offset. frequency signal to mixer 29 to provide the required compensation.

Figure 3:
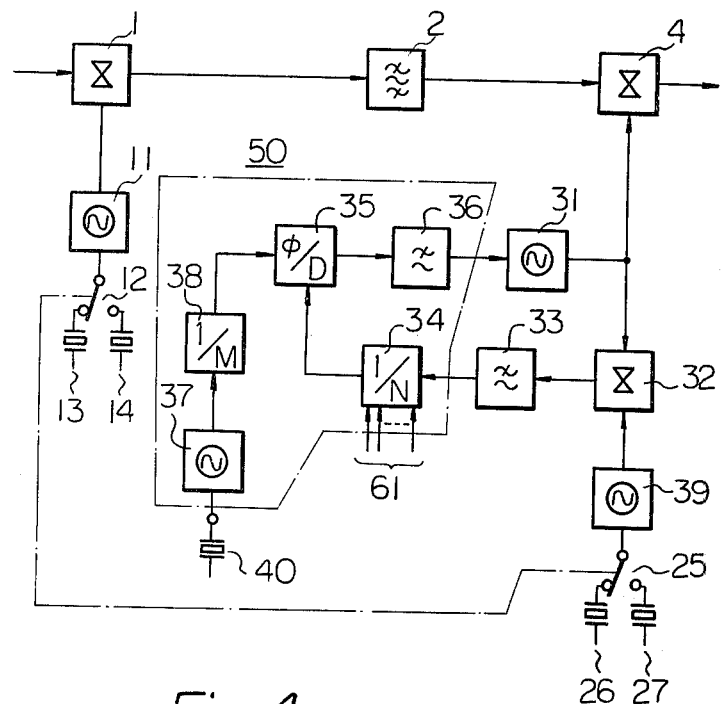
FIG. 3 is a block diagram of an SSB transmitter according to the prior art.

FIG. 3 shows a block diagram of another conventional SSB transmitter known in the prior art. The arrangement shown in FIG. 3 provides the same performance as that shown in FIG. 2, but the local signal generation arrangement employs the PLL technique. This is convenient for the case of the transmitter or receiver communication by the use of multiple channels separated by a constant frequency, referred to as the separation frequency. In FIG. 3 a standard oscillator 37 and a standard quartz resonator unit 40 are employed instead of the second oscillator 21 and plural crystal resonators 23 in FIG. 2. Since the operation and the performance of the blocks shown in FIG. 3 are the same as that in FIG. 2, except for the local signal generation circuit, so only the operation and performance of that circuit will be described in the following. The output from a voltage controlled oscillator 31 is used as the local signal, and also fed to one input of a phase comparator 33 through a second frequency mixer 32, a lowpass or bandpass filter 33, and a programmable frequency divider 34. An output signal generated from a standard oscillator 37 which oscillates at a frequency determined by the crystal resonator 40 incorporated with the standard oscillator 37 is divided in frequency by the frequency divider 38 and applied as a reference frequency signal to an input of a phase comparator 35 and compared in phase with a signal applied to the other input terminal of the phase comparator. The output signal from the phase comparator, which corresponds to the phase difference between the two input signals applied thereto, is applied to the voltage controlled oscillator 31 via a lowpass filter 36 which reduces components of the reference frequency signal from the comparator 35 and other unwanted higher components. The lowpass filter 36 is usually constituted by resistors and capacitors or a D.C. amplifier to which negative feedback is applied by an R-C network, called an active filter. By the action of the series-connected loop comprising the phase comparator 35, the lowpass filter 36, the voltage controlled oscillator 31, second mixer 32, the filter 33, and the programmable divider 34, the output frequency of the voltage controlled oscillator is locked in phase with the reference frequency. As result of this operation, the frequency of the signal at the output of said voltage-controlled oscillator 31 is given by:

$$Fe = Fj + (N/M) Fs$$

where Fj represents the frequency of the signal from oscillator 39, Fs represents the frequency of the signal from the standard oscillator 37, N represents the division ratio of the programmable divider 34, and M represents the division ratio of the frequency divider 38.

Figure 4:
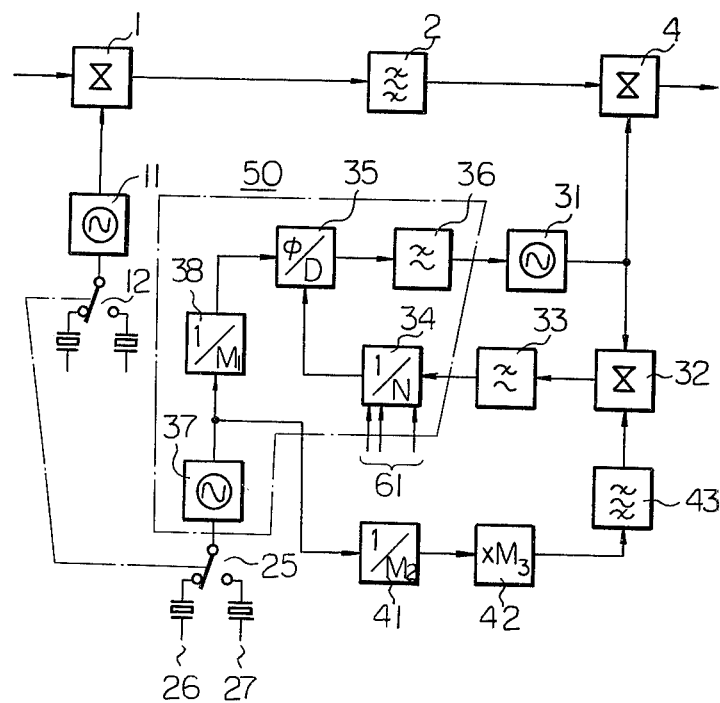
FIG. 4 is a block diagram of a novel SSB transmitter according to the present invention.

FIG. 4 shows an embodiment of the SSB transceiver according to the present invention and providing the same performance as the arrangement shown in FIG. 3. The modifications are that one oscillator and one crystal unit are deleted, while a second frequency divider 41, a frequency multiplier 42, and a filter 43 are added. However, the second divider 41 and the multiplier 42 can be omitted without sacrificing performance, since the second divider 41 can be included in the divider 38 and the multiplier can be omitted if the output signal from the standard oscillator or the divider includes sufficient harmonic components. Accordingly, the construction of FIG. 4 can be made more simple than that of FIG. 3.

When switch 11 is set to connect crystal resonator 13 to oscillator 11, then an output signal is produced from balanced modulator 1 consisting of an upper sideband signal whose frequency is the sum of the frequencies of the modulation signal and the output signal from oscillator 11, and a lower sideband signal whose frequency is the difference between that of the output oscillator 11 and that of the modulation signal. The modulation signal will normally be an audio range frequency signal, supplied from a microphone. Since the resonant frequency of crystal resonator 13 is selected to be close to the lower cut-off frequency of single sideband bandpass filter 2, the upper sideband component of the output from balanced modulator 1 will be selected by bandpass filter 2, and supplied as an intermediate frequency signal to an input of frequency mixer 4. If on the other hand crystal resonator 14 is connected to oscillator 11 by switch 12, then since the resonant frequency of crystal resonator 14 is selected to be close to the upper cut-off frequency of bandpass filter 2, the lower sideband component of the output from balanced modulator 1 will be selected by bandpass filter 2, and supplied to frequency mixer 4.

The frequency of local oscillator signal applied to frequency mixer 4 from voltage-controlled oscillator 31 can be made higher than the intermediate frequency signal (from bandpass filter 2) by an amount equal to the desired transmission frequency. In this case, a component whose frequency is the difference between that of the local oscillator signal and the intermediate frequency signal is selected from the output of frequency mixer 4 by some frequency selection means (not shown in the drawings), and is supplied to the antenna for transmission. This is called the upper heterodyne. Alternately, the local oscillator signal frequency can be made lower than that of the intermediate frequency signal. In this case, a component whose frequency is the sum of that of the local oscillator signal and that of the intermediate frequency signal is selected from the output of frequency mixer 4, and is supplied to the antennal. This is called the lower heterodyne. Depending upon whether the intermediate frequency signal from bandpass filter 2 is the upper sideband of the lower sideband signal, an upper sideband output signal or a lower sideband output signal will be produced from frequency mixer.

Figure 5:
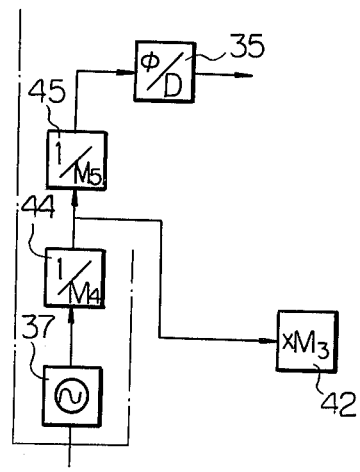
FIGS. 5, 6, 7, and 8 are block diagrams of modifications of parts of FIG. 4.

FIG. 5 shows a more practical embodiment of a SSB transceiver according to the present invention. The frequency divider 38 in FIG. 4 is separated into a third divider 44 and fourth divider 45. The third divider 44 is used for producing both the reference frequency and the offset frequency signal to be applied to the mixer 32.

Figures 8, 9:
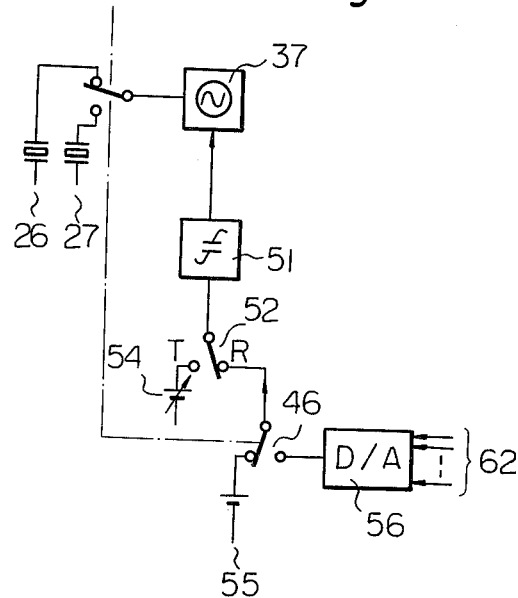
FIG. 9 is a table explaining the operation of the block diagram shown in FIG. 4, with the modification of FIG. 5 incorporated.
Figure 10:
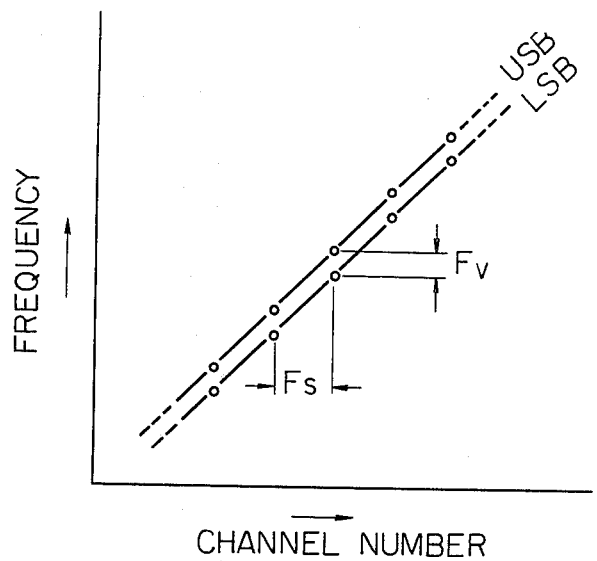
FIG. 10 and 11 are diagrams useful for explaining the characteristics of the block diagram shown in FIG. 4.
Figure 11:
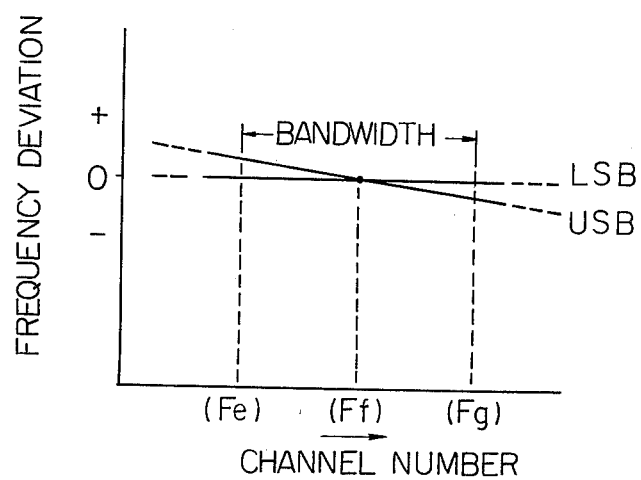

FIG. 9 is a table showing frequencies, division ratios, etc. for each part of the embodiment shown in FIG. 4 and FIG. 5. Symbols shown in FIG. 9 are as follows:

Fi: the carrier frequency of the intermediate-frequency signal to be fed to the input of the frequency mixer 4.

Fl: the output frequency of the local signal oscillator 31.

Fs: the output frequency of standard oscillator 37.

Fr: the frequency of the reference signal produced from divider 38 which divides in frequency the signal from the standard signal generator 37. Fr is an input signal of the phase comparator 35.

Fa: the frequency of the input signal of the programmable frequency divider 34.

Fj: the frequency of the output signal from the second divider 41 and the multiplier 42. This signal affords the same effect as the output signal of the offset frequency generator 39 in FIG. 3.

Fo: the carrier frequency of the signal which is the output at the antenna, and also the output of the frequency mixer 4.

M4: the dividing ratio of the third divider 44.

M5: the dividing ratio of the fourth divider 45.

M3: the multiplying ratio of the multiplier 42.

N: the division ratio of programmable frequency divider 61.

Fd: the frequency deviation occuring at the output of the local signal generation arrangement compared with the exact frequency which should be produced, because of the fact that the reference frequency differs slightly from the channel separation frequency.

From this table, it can be understood the frequency deviation Fd is very small. The frequency deviation, for example, is adequately negligible compared to the frequency deviation (±50 p.p.m.) allowed for citizens band transceivers in the U.S.A. In the table, the items shown in the two columns on the left side indicate the frequency, etc. for the condition in which, when the local signal and the intermediate frequency signal are mixed in mixer 4, the component of the mixer output whose frequency is the sum of these two input signal frequencies is selected and applied to the antenna. The items shown in the column on the right apply to the condition when the difference frequency component of the output from mixer 4 is selected and applied to the antenna. Thus in the first case, Fo is the sum of Fi and Fl, and in the second case Fo is the difference between Fi and Fl.

Figure 6:
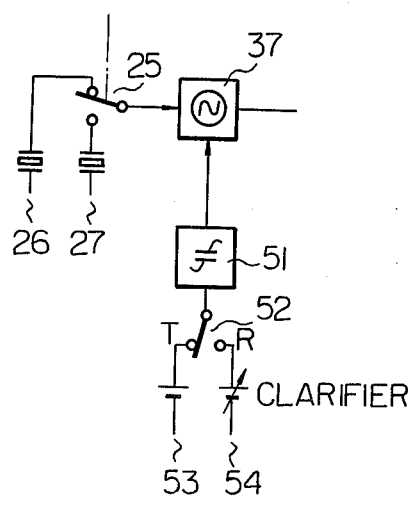

FIG. 6 shows a more practical embodiment further including a variable reactance means such as a varactor diode whose reactance is controlled by a control voltage applied thereto, first fixed bias supplying means, variable bias supplying means, and a switching means which selects and applies to said variable reactance means the output from said first fixed bias supplying means when the transceiver is operating in the transmitting mode or the output from said variable bias supplying means when the transceiver is operating in the receiving mode. FIG. 6 shows only the parts of the arrangement of FIG. 4 which are modified. The variable reactance means is used as a clarifying means for SSB and a delta-tune means for AM in the transmitting mode.

Figure 7:
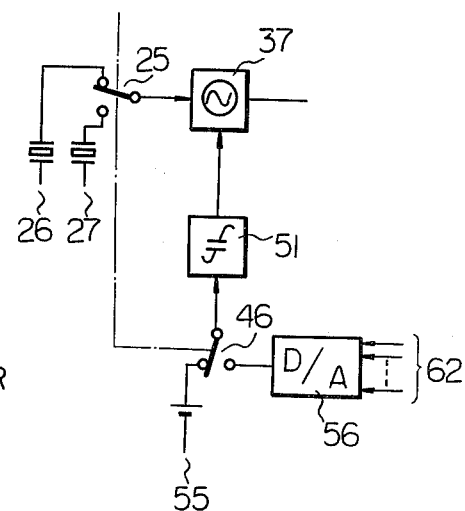

FIG. 7 shows another embodiment modified from the embodiment shown in FIG. 4 or FIG. 5, further including a variable reactance means prepared for accomplishing a purpose different from that of the embodiment shown in FIG. 6 but which functions in the same manner, a second fixed bias supplying means, a digital-to-analog converter which accepts the digital signal that is also applied to said programmable divider and produces an analog signal corresponding to said digital signal. The conversion ratio of said converter is appropriately determined so that the output of said digital-to-analog converter properly compensates said deviation Fd. An USB-LSB switching means is incorporated which selects the output of said second fixed bias supplying means when the transceiver is operating in the mode which does not cause said deviation Fd and selects the output of said digital-to-analog converter when the transceiver is operating in the mode which causes deviation Fd.

FIG. 8 shows part of an embodiment of a local signal generation arrangement incorporating both the modifications in FIG. 6 and FIG. 7. In FIG. 8, all components function as described above for FIG. 6 and FIG. 7, except that variable reactance means 51 is used in common for two purposes.

What is claimed is:

1. A single sideband radio transmitter receiver having a transmitting section for selectively producing a transmission signal consisting of an upper sideband output signal and a lower sideband output signal, comprising:

a first oscillator;

a first pair of crystal resonators;

first switch means coupled to said first oscillator and first pair of crystal resonators for selectively controlling the frequency of oscillation of said first oscillator by a first one and a second one of said first pair of crystal resonators, to thereby selectively produce a first output signal and a second output signal from said first oscillator;

balanced modulator circuit means coupled to receive a modulation signal and responsive to said first output signal from said first oscillator for producing an output signal composed of a signal whose frequency is the sum of said modulation signal frequency and said first output signal frequency and a signal whose frequency is the difference between said modulation signal frequency and said first output signal frequency, and responsive to said second output signal from said first oscillator for producing an output signal composed of a signal whose frequency is the difference between said second output signal frequency and said modulation signal frequency and a signal whose frequency is the sum of said modulation signal frequency and said second output signal frequency;

a single sideband bandpass filter having an upper cut-off frequency which is close to a resonant frequency of said first one of said first pair of crystal resonators and a lower cut-off frequency which is close to a resonant frequency of said second one of said first pair of crystal resonators, and coupled to receive the output signals from said balanced modulator, for selecting an upper sideband intermediate frequency signal, comprising said signal whose frequency is the sum of said modulation signal frequency and said first output signal frequency, and a lower sideband intermediate frequency signal, comprising said signal whose frequency is the differnce between said second ouput signal frequency and said modulation signal frequency;

a standard reference frequency oscillator;

a second pair of crystal resonators;

second switch means for selectively connecting said standard reference frequency oscillator to each of said second pair of crystal resonators, and linked to said first switch means, for developing a first reference frequency signal from said standard reference frequency oscillator when said first output signal is being produced by said first oscillator and a second reference frequency signal when said second output signal is being produced by said first oscillator;

a first frequency divider for dividing the frequency of the output signal from said standard reference frequency oscillator;

frequency multiplier means coupled to the output of said standard reference frequency oscillator, for generating a signal whose frequency is an integral multiple of the frequency of the output signal from said standard reference frequency oscillator;

a voltage-controlled oscillator, for producing a local oscillator signal, and having a frequency control input;

a first frequency mixer having a first input coupled to receive said local oscillator signal from said voltage-controlled oscillator and a second input coupled to receiver the output from said frequency multiplying means;

a filter coupled to receiver the output from said first frequency mixer, for selecting a signal of predetermined frequency from said first frequency mixer output;

a programmable frequency divider having an input coupled to receiver said selected signal from said filter, and input terminals for receiving a first control signal comprising a digital signal in parallel form, said first control signal determining the division ratio of said programmable frequency divider;

a phase comparator having a first input coupled to receive the output signal from said first frequency divider and a second input coupled to receive the output signal from said programmable frequency divider;

a low pass filter coupled to receive the output from said phase comparator, for producing a second control signal indicative of a phase difference between said first frequency divider output and said programmable frequency divider output, said second control signal being applied to said frequency control input of the voltage controlled oscillator; and a second mixer coupled to receive said local oscillator signal from the voltage controlled oscillator and to the output of said single sideband bandpass filter, being responsive to said local oscillator signal and said upper sideband intermediate frequency signal for producing said upper sideband output signal; and being responsive to said local oscillator signal and said lower sideband intermediate frequency signal for producing said lower output signal.

2. A single sideband radio transmitter receiver according to claim 1, in which said frequency multiplier means comprises a second frequency divider and a frequency multiplier connected in series with each other.

3. A single sideband radio transmitter receiver according to claim 1, in which the output signal from said standard reference frequency oscillator comprises a fundamental frequency and a plurality of harmonics thereof, and in which said frequency multiplier means comprises a filter for selecting one of said harmonics of the output signal from said standard reference frequency oscillator.

4. A single sideband radio transmitter receiver having a transmitting section for selectively producing a transmission signal consisting of an upper sideband output signal, the frequency of said upper sideband output signal being the sum of the frequency of a modulation signal and a predetermined carrier frequency, and a lower sideband output signal, the frequency of said lower sideband output signal being the difference between said predetermined carrier frequency and the frequency of said modulation signal, comprising:

a first oscillator;

a first pair of crystal resonators;

first switch means coupled to said first oscillator and said first pair of crystal resonators for selectively controlling the frequency of oscillation of said first oscillator by said first pair of crystal resonators, to thereby selectively produce a first output signal and a second output signal from said first oscillator;

balanced modulator circuit means coupled to receive said modulation signal and responsive to said output signal from said first oscillator for producing an output signal composed of a signal whose frequency is the sum of said modulation signal frequency and said first output signal frequency and a signal whose frequency is the difference between said modulation signal frequency and said first output signal frequency, and responsive to said second output signal from said first oscillator for producing an output signal composed of a signal whose frequency is the difference between said second output signal frequency and said modulation signal frequency and a signal whose frequency is the sum of said modulation signal frequency and said second output signal frequency;

a single sideband bandpass filter having an upper cut-off frequency which is close to a resonant frequency of said first one of said first pair of crystal resonators and a lower cut-off frequency which is close to a resonant frequency of said second one of said first pair of crystal resonators, and coupled to receive the output signals from said balanced modulator, for selecting an upper sideband intermediate frequency signal, comprising said signal whose frequency is the sum of said modulation signal frequency and said first output signal frequency, and a lower sideband intermediate frequency signal, comprising said signal whose frequency is the difference between said second output signal frequency and said modulation signal frequency; a standard reference frequency oscillator;

a second pair of crystal resonators;

second switch means for selectively connecting said standard reference frequency oscillator to each of said second pair of crystal resonators, and linked to said first switch means, for producing a first reference frequency signal from said reference frequency oscillator when said first output signal is being produced by said first oscillator and a second reference frequency signal when said second output signal is being produced by said first oscillator;

first frequency divider means for dividing the frequency of the output signal from said standard reference frequency oscillator, said first frequency divider means comprising a first frequency divider and a second frequency divider connected in series with each other;

frequency multiplier means coupled to the output of said first frequency divider for multiplying the frequency of said first frequency divider output signal, for thereby generating a signal whose frequency is an integral multiple of the frequency of the output signal from said standard reference frequency oscillator;

a voltage-controlled oscillator for producing a local oscillator signal, having a frequency control input;

a first frequency mixer having a first input coupled to receiver said local oscillator signal from said voltage-controlled oscillator and a second input coupled to receiver an output signal from said frequency multiplier;

a filter coupled to receiver the output from said first frequency mixer, for selecting a signal of predetermined frequency from said first frequency mixer output;

a programmable frequency divider having an input coupled to receiver said selected signal from said filter, and input terminals for receiving a control signal comprising a digital signal in parallel form, said control signal determining the division ratio of said programmable frequency divider;

a phase comparator having a first input coupled to receive the output signal from said first frequency divider means and a second input coupled to receiver the output signal from said programmable frequency divider;

a low pass filter coupled to receiver the output from said phase comparator, for producing a control signal indicative of a phase difference between said first frequency divider output and said programmable frequency divider output, said control signal being applied to said frequency control input of said voltage-controlled oscillator; and a second mixer coupled to receiver said local oscillator signal from the voltage-controlled oscillator and to the output of said single sideband bandpass filter, being responsive to said local oscillator signal and said upper sideband intermediate frequency signal for producing said upper sideband output signal, and being responsive to said local oscillator signal and said lower sideband intermediate frequency signal for producing said lower sideband output signal.

5. A single sideband radio transmitter receiver according to claim 4, in which the output signal from said first frequency divider comprises a fundamental frequency and a plurality of harmonics thereof, and in which frequency multiplier means comprises a filter for selecting one of said harmonics of the output signal from said first frequency divider.

6. A signal sideband radio transmitter receiver according to claim 1 or claim 4, and further comprising:

variable reactance means coupled to said standard reference frequency oscillator, for providing a relatively small change in the frequency of oscillation thereof in accordance with the reactance value of said variable reactance means;

a source of a fixed bias voltage;

a source of a variable bias voltage; and third switch means for selectively applying said fixed bias voltage to said variable reactance means when said radio transmitter receiver is in a transmitting mode of operation and applying said variable bias voltage to said variable reactance means when said radio transmitter receiver is in a receiving mode of operation, for thereby controlling the reactance of said variable reactance means.

7. A single sideband radio transmitter receiver according to claim 6, in which said source of a variable bias voltage comprises a digital-to-analog converter coupled to receiver said digital control signal which is applied to said programmable frequency divider, whereby the bias voltage produced by said digital-to-analog converter is determined in accordance with said digital control signal.

8. A signal sideband radio transmitter receiver according to claim 1 or claim 4, and further comprising:

variable reactance means coupled to said standard reference frequency oscillator, for providing a relatively small change in the frequency of oscillation thereof in accordance with the reactance value of said variable reactance means;

third switch means for selectively connecting said variable reactance means to first and second terminals of said third switch means when said radio transmitter receiver is set to a transmitting mode of operation and a receiving mode of operation respectively;

a source of a variable bias voltage connected to said first terminal of said third switch means;

a source of a fixed bias voltage;

a digital to analog converter coupled to receive said digital control signal which is applied to said programmable frequency divider, said digital to analog converter thereby producing a variable bias voltage in accordance with said digital control signal; and fourth switch means for selectively applying said fixed bias voltage and said variable bias voltage from said digital to an analog converter to the second terminal of said third switch means.

9. A single sideband radio transmitter receiver according to claim 6, in which said variable reactance means comprises a varactor diode.

10. A single sideband radio transmitter receiver according to claim 8, in which said variable reactance means comprises a varactor diode.

* * * * *